(12) United States Patent  
Hosokai

(10) Patent No.: US 12,501,543 B2  
(45) Date of Patent: Dec. 16, 2025

(54) ELECTRONIC MODULE, MANUFACTURING METHOD FOR ELECTRONIC MODULE, AND ENDOSCOPE

(71) Applicant: OLYMPUS CORPORATION, Tokyo (JP)

(72) Inventor: Shigeru Hosokai, Hachioji (JP)

(73) Assignee: OLYMPUS CORPORATION, Tokyo (JP)

( * ) Notice: Subject to any disclaimer, the term of this patent is extended or adjusted under 35 U.S.C. 154(b) by 654 days.

(21) Appl. No.: 17/993,143

(22) Filed: Nov. 23, 2022

(65) Prior Publication Data  
US 2023/0080558 A1    Mar. 16, 2023

Related U.S. Application Data

(63) Continuation of application No. PCT/JP2020/022476, filed on Jun. 8, 2020.

(51) Int. Cl.
| | |
|---|---|
| *H05K 1/00* | (2006.01) |
| *A61B 1/05* | (2006.01) |
| *H04N 25/70* | (2023.01) |
| *H05K 1/02* | (2006.01) |
| *H05K 1/18* | (2006.01) |

(52) U.S. Cl.  
CPC ............ *H05K 1/0284* (2013.01); *A61B 1/051* (2013.01); *H04N 25/70* (2023.01); *H05K 1/18* (2013.01); *H05K 2201/10151* (2013.01)

(58) Field of Classification Search  
CPC ............ H05K 1/0284; H05K 1/18; H05K 2201/10151; H04N 25/70; A61B 1/051  
See application file for complete search history.

(56) References Cited

U.S. PATENT DOCUMENTS

| 9,609,752 B1* | 3/2017 | Blass | H05K 3/243 |
| 10,462,907 B2* | 10/2019 | Lewis | B33Y 80/00 |

(Continued)

FOREIGN PATENT DOCUMENTS

| EP | 3 170 443 A1 | 5/2017 |
| EP | 3 322 264 A1 | 5/2018 |

(Continued)

OTHER PUBLICATIONS

International Search Report dated Sep. 8, 2020 received in PCT/JP2020/022476.

*Primary Examiner* — Pete T Lee  
(74) *Attorney, Agent, or Firm* — Scully, Scott, Murphy & Presser, P.C.

(57) ABSTRACT

An electronic module includes a first structure including a flat mounting surface on which an integrated circuit is mounted and a wiring surface including a surface including a portion that changes in a direction perpendicular to the mounting surface, a wire connected to the integrated circuit being extended on the wiring surface, a second structure disposed with a dielectric region interposed with respect to the wiring surface of the first structure, a metal pattern being provided on the second structure, and at least one spacer member that equalizes thickness of the dielectric region between the wire and the metal pattern in an entire range between the mounting surface and the wiring surface including the surface including the portion that changes in the direction perpendicular to the mounting surface.

13 Claims, 10 Drawing Sheets

(56) References Cited

U.S. PATENT DOCUMENTS

| | | |
|---|---|---|
| 2017/0097479 A1* | 4/2017 | Oomori ................ H05K 1/0298 |
| 2017/0150875 A1 | 6/2017 | Shimizu et al. |
| 2018/0145397 A1 | 5/2018 | Nakagawa et al. |
| 2019/0261842 A1 | 8/2019 | Miyahara et al. |
| 2020/0120796 A1 | 4/2020 | Awaji |

FOREIGN PATENT DOCUMENTS

| | | |
|---|---|---|
| EP | 3 629 637 A1 | 4/2020 |
| JP | H06-21681 A | 1/1994 |
| JP | 2001-326505 A | 11/2001 |
| JP | 2008-130601 A | 6/2008 |
| JP | 2008-159933 A | 7/2008 |
| JP | 2008-159942 A | 7/2008 |
| JP | 2011-134777 A | 7/2011 |
| JP | 2016-086068 A | 5/2016 |
| JP | 2016-518693 A | 6/2016 |
| JP | 2019-016678 A | 1/2019 |
| WO | 2016/203797 A1 | 12/2016 |
| WO | 2017/006614 A1 | 1/2017 |
| WO | 2018/092234 A1 | 5/2018 |
| WO | 2019/008816 A1 | 1/2019 |
| WO | 2021/181526 A1 | 9/2021 |
| WO | 2021/181530 A1 | 9/2021 |
| WO | 2021/186519 A1 | 9/2021 |

\* cited by examiner

ELECTRONIC MODULE, MANUFACTURING METHOD FOR ELECTRONIC MODULE, AND ENDOSCOPE

CROSS REFERENCE TO RELATED APPLICATION

This application is a continuation application of PCT/JP2020/022476 filed on Jun. 8, 2020, the entire contents of which are incorporated herein by this reference.

BACKGROUND OF THE INVENTION

1. Field of the Invention

The present invention relates to an electronic module excellent in high frequency characteristics, a manufacturing method for the electronic module, and an endoscope.

2. Description of the Related Art

In recent years, a trend of a reduction in sizes of electronic components has been accelerating according to spread of portable terminals. A technique for imparting a predetermined function to a substrate (a molded component) on which the electronic components are mounted and pursuing a reduction in size has been actively proposed. For example, Japanese Patent Application Laid-Open Publication No. 2016-86068 discloses, as a technique used in an image pickup apparatus, a technique for reducing a size of a substrate including a base section and a wiring pattern formed on an outer surface of the base section, having a recess formed on a mounting surface, and functioning as a reflector of a light emitting element as well. In Japanese Patent Application Laid-Open Publication No. 2016-86068, a flat circuit board is set in contact with and mounted on a bottom section of a recess of a three-dimensional circuit substrate (a molded component) to form a closed space and a mounting space for components is secured. A molded component functioning as a substrate as well is formed by a so-called MID (molded interconnect devices) technique.

MID means a three-dimensionally molded circuit component obtained by integrally forming wires for electronic circuit on a surface of a three-dimensional molded product such as an injection molded product. By using the MID technique, unlike a conventional two-dimensional circuit, wires for circuit can also be formed in an inclined surface, a perpendicular surface, a curved surface, a through-hole inside a molded body, and the like. Consequently, it is possible to extend wires not only in two-dimensional directions as in a normal flat printed wiring board but also in three-dimensional directions and perform power feeding and communication with mounted electronic components. Since a housing itself and a wiring board can be integrated, the MID contributes to a cost reduction and the like by a reduction in the number of components.

SUMMARY OF THE INVENTION

An electronic module according to an aspect of the present invention includes: a first structure including a mounting surface having a planar shape on which an integrated circuit is mounted and a wiring surface including a surface including a portion that changes in a direction perpendicular to the mounting surface, a wire connected to the integrated circuit being extended on the wiring surface; a second structure disposed with a dielectric region interposed with respect to the wiring surface of the first structure, a metal pattern being provided on the second structure; and at least one spacer member that equalizes thickness of the dielectric region between the wire and the metal pattern in an entire range between the mounting surface and the wiring surface including the surface including the portion that changes in the direction perpendicular to the mounting surface.

A manufacturing method for an electronic module according to an aspect of the present invention includes clamping, using at least one spacer member, a first structure including a mounting surface having a planar shape on which an integrated circuit is mounted and a wiring surface including a surface including a portion that changes in a direction perpendicular to the mounting surface, a wire connected to the integrated circuit being extended on the wiring surface, and a second structure on which a metal pattern is provided, in a state in which a dielectric region having equal thickness is interposed between the wire and the metal pattern in an entire range between the mounting surface and the wiring surface including the surface including the portion that changes in the direction perpendicular to the mounting surface.

An endoscope according to an aspect of the present invention includes: an insertion section; an electronic module including a first structure provided in the insertion section and including a mounting surface having a planar shape on which an integrated circuit is mounted and a wiring surface including a surface including a portion that changes in a direction perpendicular to the mounting surface, a wire connected to the integrated circuit being extended on the wiring surface, a second structure disposed with a dielectric region interposed with respect to the wiring surface of the first structure, a metal pattern being provided on the second structure, and at least one spacer member that equalizes thickness of the dielectric region between the wire and the metal pattern in an entire range between the mounting surface and the wiring surface including the surface including the portion that changes in the direction perpendicular to the mounting surface; and an image pickup apparatus loaded on the integrated circuit.

DETAILED DESCRIPTION OF THE PREFERRED EMBODIMENTS

Embodiments of the present invention are explained in detail below with reference to the drawings.

First Embodiment

Figure 1:
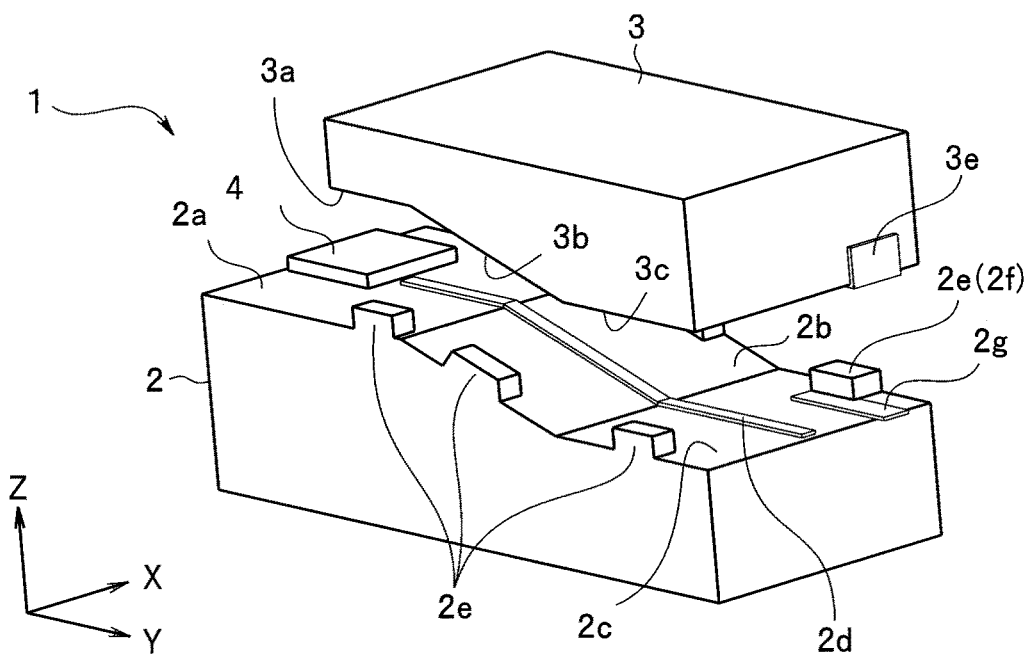
FIG. 1 is a perspective view showing an MID module according to a first embodiment of the present invention.
Figure 2:
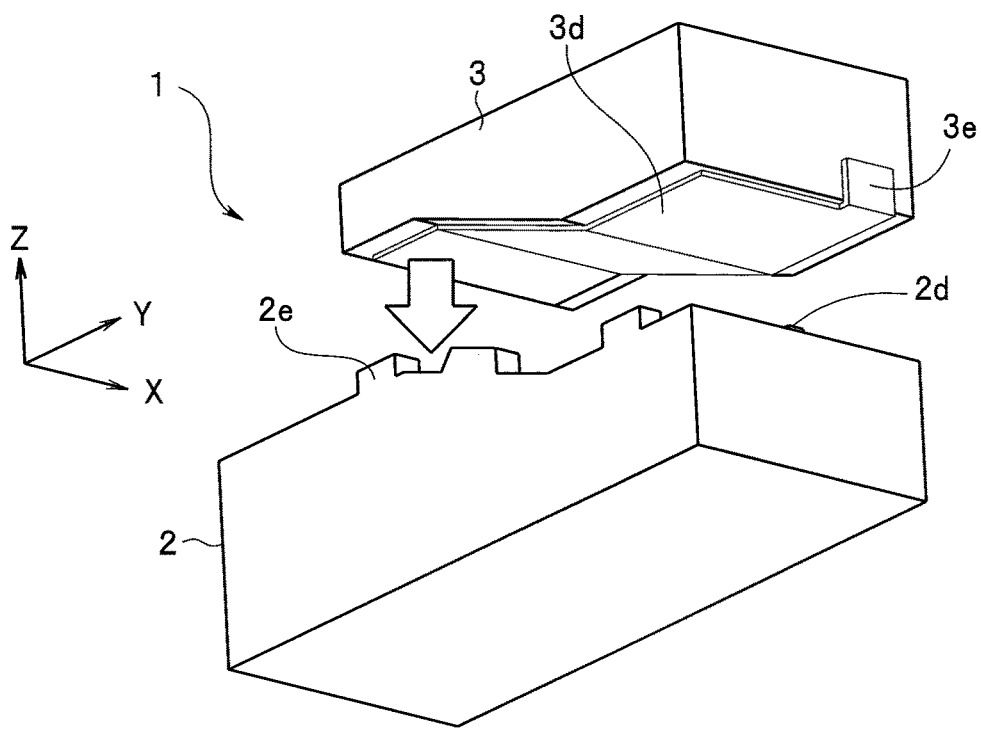
FIG. 2 is a perspective view for explaining a configuration of an electronic module according to the first embodiment of the present invention.

FIG. 1 and FIG. 2 are perspective views for explaining a configuration of an electronic module according to a first embodiment of the present invention.

Note that, in respective figures used for the following explanation, scales are sometimes differentiated for each of components in order to show the respective components in degrees of sizes recognizable on the drawings. The present invention is not limited to only quantities of the components, shapes of the components, ratios of sizes of the components, and relative positional relations among the respective components described in these figures.

In the present embodiment, a metal pattern opposed at a predetermined interval to a wiring layer formed on a surface of an MID, which is a molded component (a structure) by the MID technique, is enabled to be disposed to thereby enable improvement of high frequency characteristics of the molded component.

Note that, as the MID, in particular, a micro compound machining technique disclosed in Japanese Patent Application Laid-Open Publication No. 2008-159942 and Japanese Patent Application Laid-Open Publication No. 2011-134777 can be used. With the micro compound machining technique, by using a molded surface activation processing technique, a laser patterning method, and the like for an MID technique for forming an electric circuit on a surface of an injection molded product, it is possible to realize a so-called 3D mounting device capable of performing fine patterning and bare chip mounting.

(Difficulty in Improvement of High Frequency Characteristics)

Incidentally, when a high-frequency signal flows to a substrate wire, influence of an impedance characteristic neglectable in a low-frequency signal appears. When a signal is transmitted to a line of a wire, a voltage and an electric current are paired and transmitted as a "traveling wave". A ratio of the voltage and the electric current at this time is characteristic impedance.

As a model of a transmission line, a microstrip type in which a ground surface is set on one side of a double-sided substrate and a signal wire is arranged on an opposite surface across an insulating layer is sometimes adopted. About the microstrip type, Japanese Patent Application Laid-Open Publication No. 2001-326505 discloses a proposal for, when a conductor strip is disposed in a stacking region on a core substrate by a buildup method, adjusting characteristic impedance selectively using electrodes on both surfaces of the core substrate.

The characteristic impedance in this case is determined by width of a wire (a wiring pattern), thickness of a metal conduction section (the wiring pattern), a distance between a ground (GND) layer functioning as a reference layer and the wiring pattern, and a specific dielectric constant of an insulator between the GND layer and the wiring pattern. In other words, the characteristic impedance decreases when width orthogonal to an energization direction of the wiring pattern or thickness of the wiring pattern is increased or a sectional area of the wiring pattern is increased. The characteristic impedance also decreases when the distance between the wiring pattern and the GND layer is reduced (thickness of the insulator between the wiring pattern and the GND layer is reduced).

For example, when it is attempted to form a single wire with characteristic impedance Z0 set to 50Ω (ohm) through electrode formation of the MID, if a specific dielectric constant of an MID material is approximately equivalent to a specific dielectric constant of general resin, resin thickness between the wiring pattern and the GND layer has to be set extremely small when wiring width of the MID is refined. Machining of resin of the MID becomes difficult. Conversely, when the resin thickness is set large, for example, the wiring width has to be secured wide. This is a restriction when it is desired to configure a structure by the MID (an MID structure) small.

In other words, although the characteristic impedance is adjustable by setting of an inter-layer distance and a pattern size, difficulty in machining is present for optimization of the characteristic impedance. Note that there is the same problem when a differential line with differential impedance set to 100Ω is formed in the MID considering differential transmission.

Note that, as a model of the transmission line, not only the microstrip type but also a strip type in which a substrate is multilayered and a front and a rear of a signal wire is sandwiched by a ground surface via an insulating layer. However, in the MID, after resin is molded, a wire is formed on a surface of the resin. Therefore, a multilayer wire such as an FPC (flexible printed circuits) or a printed wiring board cannot be formed. Therefore, conventionally, it has been difficult to improve high-frequency characteristics of the MID.

Therefore, in the present embodiment, on a surface side of an MID on which a wire is formed, a member including GND layers on surfaces that can be disposed to be opposite with a predetermined distance separated from each other is provided to optimize the characteristic impedance to thereby make it possible to improve the high-frequency characteristics.

(Configuration)

Figure 3:
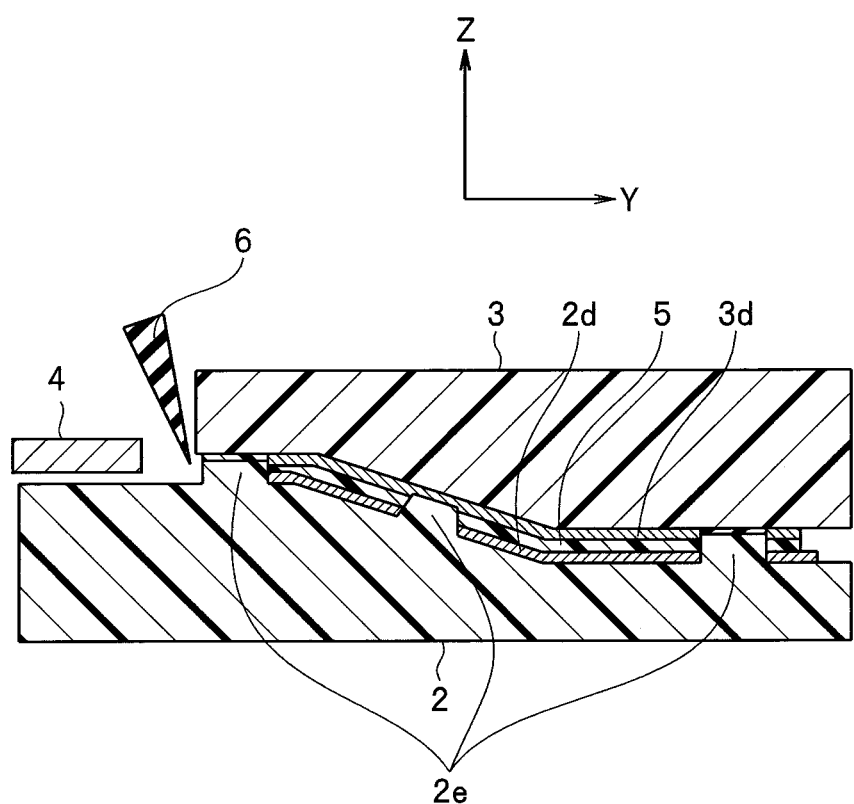
FIG. 3 is a schematic sectional view of the electronic module.

FIG. 1 and FIG. 2 show an example in which an electronic module 1 is configured by MID structures 2 and 3. Note that, although the MID structure 3 is described, this member does not always need to be configured by the MID. As shown in FIG. 3, the MID structures 2 and 3 are combined and clamped to configure the electronic module 1. However, in FIG. 1 and FIG. 2, a state in which the MID structures 2 and 3 are not clamped is shown.

The MID structure 2 has a three-dimensional structure having a predetermined shape. In the example shown in FIG. 1 and FIG. 2, the MID structure 2 is a substantially rectangular parallelepiped. An upper surface of the MID structure 2 includes two surfaces 2a and 2c having steps and an inclined surface 2b provided between the surfaces 2a and 2c. Note that the shape of the MID structure 2 is an example and may be any shape including a spherical surface. For example, the shape of the MID structure 2 may be a shape corresponding to a shape of electronic equipment in which the electronic module 1 is incorporated or may be a shape suitable for realizing functions of the electronic equipment and the electronic module 1.

In the example shown in FIG. 1 and FIG. 2, an IC (integrated circuit) 4 is loaded on the surface 2a of the upper surface of the MID structure 2. On the surface 2a (hereinafter also referred to as mounting surface 2a), the inclined surface 2b, and the surface 2c, a pattern of a wire 2d is formed between the IC 4 and an outer side end side of the surface 2c. Electric connection is possible between an outside of the electronic module 1 and the IC 4 by the wire 2d. Note that, in FIG. 1 and FIG. 2, only one wire 2d is shown for simplification of the drawings. However, usually, a plurality of wires for power supply, GND (ground), and a signal are provided as the wire 2d.

On a surface of the IC 4 parallel to the mounting surface 2a, a direction parallel to one side of the mounting surface 2a is represented as a Y direction, a direction orthogonal to the Y direction is represented as an X direction, and a direction perpendicular to the surface of the IC 4 parallel to the mounting surface 2a is represented as a Z direction. Note that, in the following explanation, the definitions of the X, Y, and Z directions are the same. Since the MID structure 2 is manufactured by the MID technique, the wires 2d can be drawn around in various directions along a surface shape of the MID structure 2 that is three-dimensionally devised. In other words, the wires 2d for a power supply and a signal can be formed not only in a surface parallel to the mounting surface 2a but also in portions of different heights that change from the mounting surface 2a in the Z direction.

In other words, the surfaces 2b and 2c are surfaces (hereinafter referred to as wiring surfaces as well) including surfaces (inclined surfaces) inclined with respect to the mounting surface 2a. Note that, in FIG. 1 and FIG. 2, the inclined surface of the surface 2b indicates an example of a plane not orthogonal to the mounting surface 2a. However, the inclined surface may include a surface orthogonal to the mounting surface 2a or the inclined surface may be a curved surface. In other words, the wiring surface may be considered a surface including an inclined surface with respect to the mounting surface 2a, may be considered a surface including a portion that changes in a direction perpendicular to the mounting surface 2a, or can be considered a surface including a surface not parallel to the mounting surface 2a. In any case, the wiring surface may include a surface not orthogonal to the mounting surface 2a, a surface orthogonal to the mounting surface 2a, a surface at height in the Z direction different from the height of the mounting surface 2a, and a curved surface.

The MID includes, besides functions of mounting components and providing electric wires, a function of leading a signal and a power supply to an outside of the electronic module and a fixing function at the time when the electronic module is incorporated in an equipment main body. Therefore, besides a restriction on machining, there is also a restriction on deign about an external shape, thickness, and the like of the MID structure 2. Therefore, as explained above, when the pattern of the GND layer functioning as the reference layer is provided on the rear surface of the MID structure 2, design considering the characteristic impedance cannot be adopted and the characteristic impedance of the signal wire cannot be optimized. Note that, as explained above, there is also a method of widening the pattern of the wire 2a. However, in that case, a dimension in an X direction increases and a size increases.

Like a multilayer substrate, it is also conceivable to form the GND layer functioning as the reference layer in another layer such as a lower part of the layer of the wire 2d. However, the MID is manufactured by forming a metal thin film in molded resin or applying metal plating to the molded resin and, then, performing laser irradiation when an unnecessary part of the metal is removed or a metal seed is formed in an organic metal composite. Therefore, even if wiring layer formation on the surface is easy, multilayering is difficult.

Therefore, in the present embodiment, the MID structure 3 including the GND layer functioning as the reference layer is provided. The MID structure 3 has a three-dimensional structure having a predetermined shape including, in a part, a surface shape corresponding to the surface shape of the MID structure 2. In the example shown in FIG. 1 and FIG. 2, the MID structure 3 is a substantially rectangular parallelepiped. A bottom surface of the MID structure 3 includes two surfaces 3a and 3c having steps and an inclined surface 3b provided between the surfaces 3a and 3c. The surfaces 3a to 3c of the bottom surface of the MID structure 3 are formed in shapes corresponding to the surfaces 2a to 2c. Therefore, depending on disposition of the MID structures 2 and 3, distances to the surfaces 3a to 3c can be set to an equal interval over an entire range of the surfaces 2a to 2c.

Note that the shape of the MID structure 3 is an example and may be any shape including a spherical surface excluding a surface opposed to a wire on which the wire 2d of the MID structure 2 is disposed. For example, the shape of the MID structure 3 may be a shape corresponding to a shape of electronic equipment in which the electronic module 1 is incorporated or may be a shape suitable for realizing functions of the electronic equipment and the electronic module 1.

The MID structure 3 is a member formed by a nonconductive member such as resin. On the surfaces 3a to 3c, a metal (plane) pattern 3d functioning as the GND layer is provided over substantially an entire region. As indicated by an arrow in FIG. 2, by disposing the MID structure 2 and the MID structure 3 to be opposed to separate the surfaces 2a to 2c and the surfaces 3a to 3c by a predetermined distance, the metal pattern 3d is designed to extend along and at a specific distance apart from one or all of a plurality of wires 2d respectively according to undulations in the Y direction of the wires 2d of the MID structure 2.

Note that, if the characteristic impedance of the wire 2d can be optimized, the distance to the surfaces 3a to 3c do not always has to be set to the equal interval in the entire range of the surfaces 2a to 2c. For example, a part of the surfaces 3a to 3c sometimes does not have to be formed at the equal interval or the metal pattern 3d sometimes does not have to be formed in substantially the entire region of the surfaces 3a to 3c. In this case, it is possible to improve flexibility of design of the MID structure 3. The metal pattern 3d is electrically connected to a terminal 3e at an end side of the surface 3c. The terminal 3e is set to, for example, ground (GND) potential, whereby the metal pattern 3d functions as the GND layer.

In the present embodiment, spacers 2e having a convex shape are provided in order to specify a distance between the wire 2d of the MID structure 2 and the metal pattern 3d of the MID structure 3 to a specific distance. In the example shown in FIG. 1 and FIG. 2, an example is shown in which the spacers 2e are provided in six places at end sides of the surfaces 2a to 2c of the MID structure 2. The MID structure 2 and the MID structure 3 are opposed and closely attached with the spacers 2e interposed, whereby all the wires 2d and the metal pattern 3d are specified to the predetermined distance.

Note that disposition positions of the spacers 2e are not limited to FIG. 1 and FIG. 2. The disposition positions, shapes, sizes, and the like of the spacers 2e can be set as appropriate if all the wires 2d and the metal pattern 3d can be maintained at the specific distance. For example, the spacers 2e may be provided on the surfaces 3a to 3c of the MID structure 3.

By providing the spacers 2e, a dielectric region is formed in a gap between the wire 2d and the metal pattern 3d to prevent the wire 2d and the metal pattern 3d from short-circuiting.

Note that, in FIG. 1 and FIG. 2, an example is explained in which the wire 2d is disposed on the surfaces of the surfaces 2a to 2c. However, when thickness of the wire 2d is considered, grooves may be formed on the surfaces 2a to 2c and the wire 2d may be disposed to be embedded in the grooves. For example, by embedding the wire 2d by the thickness of the wire 2d, it is also possible to configure only surface of the wire 2d to be exposed from the surfaces 2a to 2c. The wire surface may be below the surfaces or may be swelled.

In the embodiment configured as explained above, the characteristic impedance of the wire 2d is determine by the width and the thickness of the wire 2d, the distance between the wire 2d and the metal pattern 3d, and a specific dielectric constant of the insulator between the wire 2d and the metal pattern 3d. Therefore, it is possible to optimize the characteristic impedance by setting the distance between the wire 2d and the metal pattern 3d, that is, thickness of the dielectric region as appropriate with the spacers 2e.

As explained above, in the present embodiment, the member including the GND layer is provided on the surfaces that can be disposed to be separated the predetermined distance from and opposed to the wires provided on the surface of the MID. The distance between the member and the MID surface is specified by the spacers to make it possible to optimize the characteristic impedance irrespective of the thickness of the MID structure 2. Consequently, it is possible to improve the high-frequency characteristics while satisfying the restrictions in the machining and the design of the MID and enabling achievement of necessary functions.

(Dielectric Body)

In the above explanation, a material with which the dielectric region between the wire 2d and the metal pattern 3d is filled is not referred to. However, the dielectric region may be filled with air. A dielectric body having a predetermined specific dielectric constant may be provided in the dielectric region. FIG. 3 is a schematic sectional view showing an example of this case. In FIG. 3, configurations of the MID structure 2 and the MID structure 3 are the same as the configurations shown in FIG. 1 and FIG. 2. FIG. 3 shows, viewing from side surface sides of the two structures 2 and 3, a cross section of a state in which the wire 2d on the structure 2 and the metal pattern 3d on the surfaces 3a to 3c of the structure 3 are in contact while being separated an appropriate distance by a plurality of protrusion-like spacers 2e.

In the example shown in FIG. 3, an adhesive (a dielectric body) 5 having a predetermined specific dielectric constant is provided in the gap (the dielectric region) between the surfaces 2a to 2c of the MID structure 2 and the surfaces 3a to 3c of the MID structure 3. For example, the adhesive 5 is injected into the dielectric region between the surfaces 2a to 2c of the MID structure 2 and the surfaces 3a to 3c of the MID structure 3 by an injection nozzle unit 6. In other words, in this case, not the air but the adhesive 5 is interposed between the wire 2d and the metal pattern 3d. The characteristic impedance of the wire 2d can be specified by the specific dielectric constant of the adhesive 5 as well. Consequently, flexibility of design in optimizing the characteristic impedance increases.

Note that, in FIG. 3, the Y direction is illustrated as horizontal. However, by disposing the electronic module 1 to set the Y direction in a gravity direction and injecting the adhesive 5, it is possible to spread the adhesive to the entire dielectric region including a wiring direction using gravity.

In the above explanation, the adhesive 5 is injected into the dielectric region by the injection nozzle unit 6 to fill the dielectric region in a state in which the MID structure 2 and the MID structure 3 are clamped. However, after the adhesive 5 is applied to an upper surface excluding the spacers 2e of the MID structure 2, the MID structure 3 may be clamped to the MID structure 2. Instead of filling the dielectric region with the adhesive 5, a dielectric film having a predetermined specific dielectric constant may be stuck to the dielectric region.

In the electronic module 1 shown in FIG. 1 to FIG. 3, the wire 2d forms a wiring pattern extended in at least a Z direction and the Y direction on the mounting surface 2a spreading in the X direction and the Y direction, an electrode surface of the metal pattern 3d changes to follow, in the Y direction, a change in the Y direction of the wiring pattern, and a plurality of spacers 2e are provided such that the pattern of the wire 2d and the metal pattern 3d keep a constant gap (dielectric region) with respect to the direction change. By forming the spacers 2e in a shape of a plurality of protrusions, the dielectric region can be checked by viewing or the like from gaps among the spacers 2e. A check at a module manufacturing time and an inspection time is easy. When the dielectric region is filled with the resin as shown in FIG. 3, the resin may properly fill in the gaps among the spacers 2e. In other words, the gaps among the spacers 2e are useful for absorbing an error of a filling amount.

(Connection to the GND Potential)

In the above explanation, the GND potential is given to the metal pattern 3d by the terminal 3e. However, the GND potential may be given by another method. For example, a method of configuring one of the plurality of spacers 2e with a conductive material may be adopted. In FIG. 1, an example is shown in which a spacer 2f is configured by a conductive material and disposed in a position opposed the metal pattern 3d. A wiring pattern 2g electrically connected to the spacer 2f is also formed on the surface 2c of the MID structure 2. By clamping the MID structure 2 and the MID structure 3 with the spacers 2e and 2f interposed, the metal pattern 3d is in contact with the spacer 2f and the wiring pattern 2g and the metal pattern 3d are electrically connected. Consequently, by setting the wiring pattern 2g to the GND potential, it is possible to form the metal pattern 3d as the GND layer. Note that only one of the terminal 3e and the wiring pattern 2g only has to be formed.

As explained above, according to the present embodiment, thickness of the dielectric region can be set extremely small by the spacer. The wire 2d connected to the IC can be thinned and a large number of wires 2d can be arranged. For example, the thickness of the dielectric region by the spacer can be reduced to several ten micrometer order. A plurality of wires 2d with the characteristic impedance optimized can be wired in a small module in a range in which thin line machining by a wire forming process is possible. Therefore, the electronic module 1 is excellent in high-frequency characteristics, although small in size, and it is possible to construct high-performance and high-function electronic equipment by using the electronic module 1.

In other words, by making it possible to dispose a constant voltage pattern (a GND pattern) while keeping a constant interval from a wiring pattern, an extending direction of which three-dimensionally changes, it is possible to configure an electronic module small in size but high in performance that performs information transmission to the IC at high speed.

By manufacturing the structure 3 with the MID as well, it is possible to easily form the structure 3 with a GND pattern disposed to be opposed to the MID structure 2, an extending direction of a pattern of which three-dimensionally changes, while following the three-dimensional change, that is, fixing the thickness of the dielectric region.

As a member that keeps the gap between the GND pattern and the wires constant, here, the spacers, which are protruding objects, are adopted. Consequently, it is possible to provide the MID structures 2 and 3 having the following characteristics.

In other words, a signal wire is formed in the MID structure 2. The MID structure 2 includes protrusions that can control an interval between the signal wire and a plane surface of metal that guarantees a specific interval to the signal wire and has reference potential. A space formed by the protrusions can be filled with an adhesive (epoxy resin or the like) having a predetermined dielectric constant. Since the metal pattern is separated at a managed dielectric constant, it is possible to perform high-performance IC control that guarantees characteristic impedance of the wires and stably satisfies performance Note that by filling the space with the adhesive, it is possible to fix the two structures while maintaining an interval between the two structures constant. It does not occur that dust or the like enters the gap and adheres to the structures or the like to deteriorate electric characteristics of the wires.

(Modification)

Figure 4:
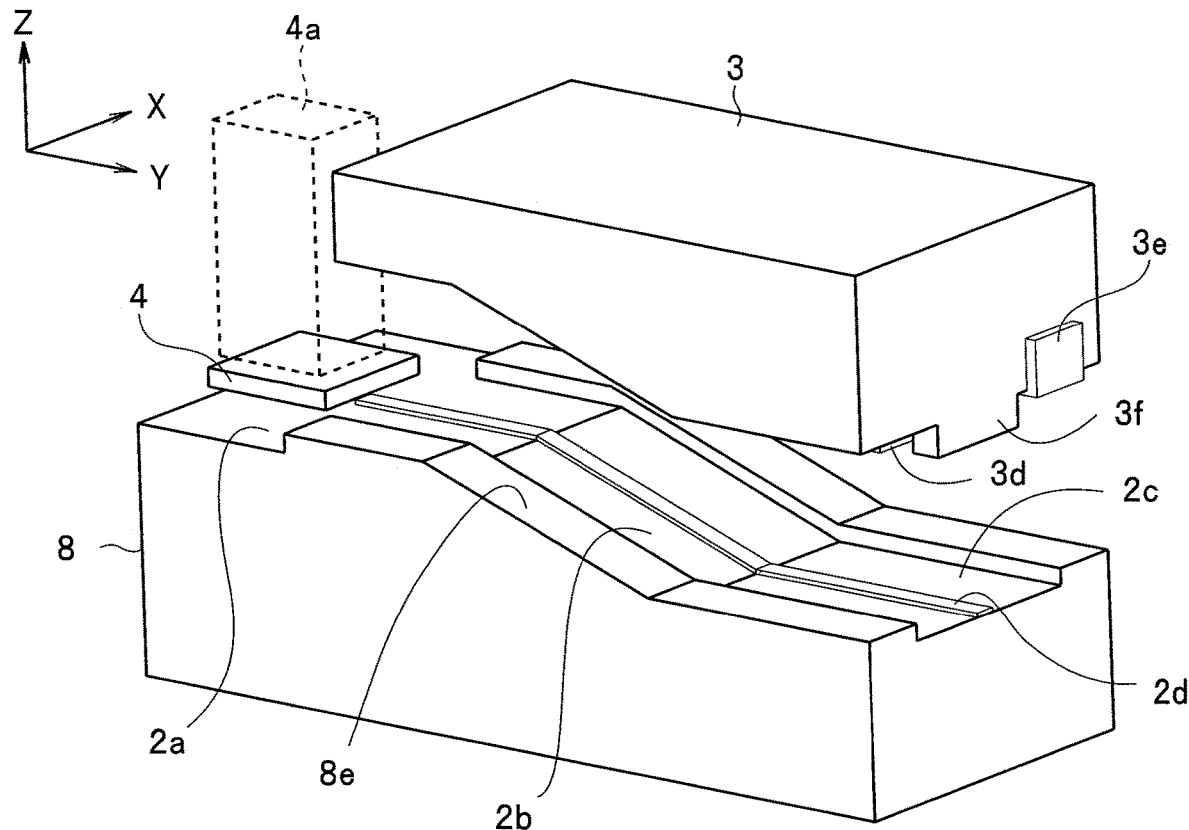
FIG. 4 is a perspective view showing a modification.

FIG. 4 is a perspective view showing a modification. In FIG. 4, the same components as the components shown in FIG. 1 and FIG. 2 are denoted by the same reference numerals and signs. An MID structure 8 shown in FIG. 4 has the same configuration as the configuration of the MID structure 2 shown in FIG. 1. The MID structure 8 is different from the MID structure 2 in that blocking walls 8e are adopted instead of the spacers 2e. Note that, in FIG. 4, an image pickup device is adopted as the IC 4. A laminated lens 4a is loaded on an image pickup surface of the IC 4 configuring an image pickup device such as a CMOS sensor. Light made incident on the laminated lens is guided to the image pickup surface of the IC 4 and obtains a picked-up image through photoelectric conversion of the IC 4. In other words, in FIG. 4, an image pickup apparatus (an image pickup module) is configured by the IC 4 and the laminated lens 4a.

The blocking walls 8e have the same height as the spacers 2e in the Z direction and are continuously configured in a wall shape along edge sides of the surfaces 2a to 2c instead of the plurality of spacers 2e having the protrusion shape shown in FIG. 1 to FIG. 3. By clamping upper surfaces of the blocking walls 8e and the bottom surface (the surfaces 3a to 3c) of the MID structure 3, thickness of the dielectric region between the wire 2d and the metal pattern 3d can be specified as explained with reference to FIG. 1 to FIG. 3. In other words, in an example shown in FIG. 4, the wire 2d of the structure 8 and the metal pattern 3d of the structure 3 are kept at an optimum interval and the characteristic impedance of the wire 2d is guaranteed at a proper value.

Since the blocking walls 8e close the dielectric region in substantially entire regions of side surfaces of the MID structures 8 and 3, when the dielectric region is filled with the adhesive 5, the adhesive 5 can be prevented from flowing out from the side surfaces.

In the MID structure 3, a wall structure section 3f may be provided at the end side of the surface 3c. The wall structure section 3f has a function of optimizing a filling amount when the dielectric region is filled with the adhesive 5.

Figure 5:
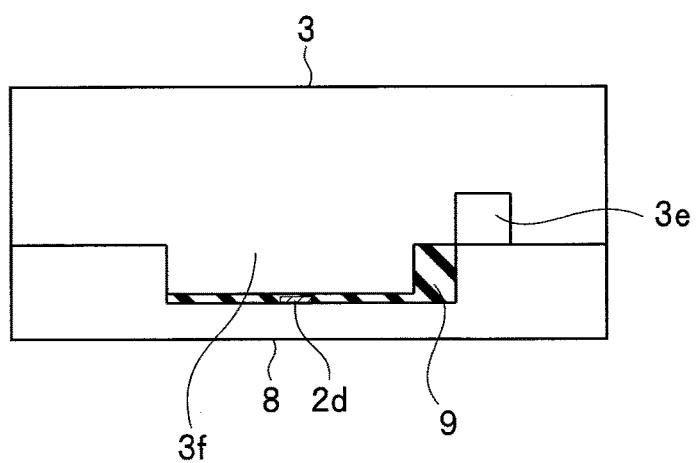
FIG. 5 is an explanatory diagram for explaining the electronic module.

FIG. 5 is an explanatory diagram for explaining this function and shows, viewing from the Y direction, a state in which the MID structures 8 and 3 are clamped and the dielectric region is filled with the adhesive 5. In the X direction, length of the wall structure section 3f is configured slightly shorter than a distance between the blocking walls 8e. Consequently, as shown in FIG. 5, an opening section 9 is formed between the wall structure section 3f and the blocking walls 8e in the X direction in a state in which the MID structure 8 and the MID structure 3 are clamped.

When the dielectric region is filled with the adhesive 5, the wall structure section 3f closes a part of openings at end sides of the surfaces 2c and 3c and forms the opening section 9 having appropriate dimensions. Consequently, it is possible to prevent the adhesive 5 from easily spilling to an outside of the dielectric region and fill the dielectric region with the adhesive 5 in an appropriate resin filling amount. In other words, when the dielectric region is filled with the adhesive 5, the adhesive 5 only has to reach the opening section 9 and properly fill the opening section 9. An error of a filling amount is absorbed by a space in a tunnel-like portion of the opening section 9.

In this way, the MID structures 8 and 3 having the following characteristics can be provided. In other words, a signal wire is formed in the MID structure 8. The MID structure 8 includes protrusions (wall structure sections) that can control an interval between the signal wire and a plane surface of metal that guarantees a specific interval to the signal wire and has reference potential. In an electronic module by the MID structures 8 and 3, a space formed by the protrusions can be filled with an adhesive (urea resin or the like) having a predetermined dielectric constant. Therefore, a characteristic impedance of a wire can be guaranteed. It is possible to provide a small electronic module capable of performing high-performance IC control that has high workability, reduces manhour of work, has high reliability, guarantees appropriate characteristic impedance, and stably satisfies performance.

In FIG. 4, as an example of an electronic module that can be configured by the MID structures 8 and 3, an example is shown in which the IC 4 and the laminated lens 4a are loaded to configure an image pickup module as a whole. An object optical image is made incident on the laminated lens from a direction (the Z direction) orthogonal to a mounting surface of the IC 4. The IC 4 can extend the wires in the Y direction. Therefore, it is also possible to incorporate the image pickup module configured by the electronic module shown in FIG. 1 to FIG. 4 in, for example, a side-viewing endoscope distal end portion and guide a control signal and an image pickup signal of the image pickup module to an opposite side of a direction of endoscope insertion.

(Connection to External Equipment)

In the above explanation, a method of connecting the wire 2d and the metal pattern 3d to the external equipment is omitted. However, for example, a method of performing electric connection by soldering may be adopted. For example, when the electronic module including the two structures explained with reference to FIG. 1 to FIG. 5 is incorporated in external equipment such as an endoscope, a cable from external equipment including a control unit that controls the electronic module is soldered to the wire 2d and the metal pattern 3d. Note that electrodes may be provided in the wire 2d and the metal pattern 3d. The external equipment may be connected to the electrodes using connectors and sockets.

Figure 6:
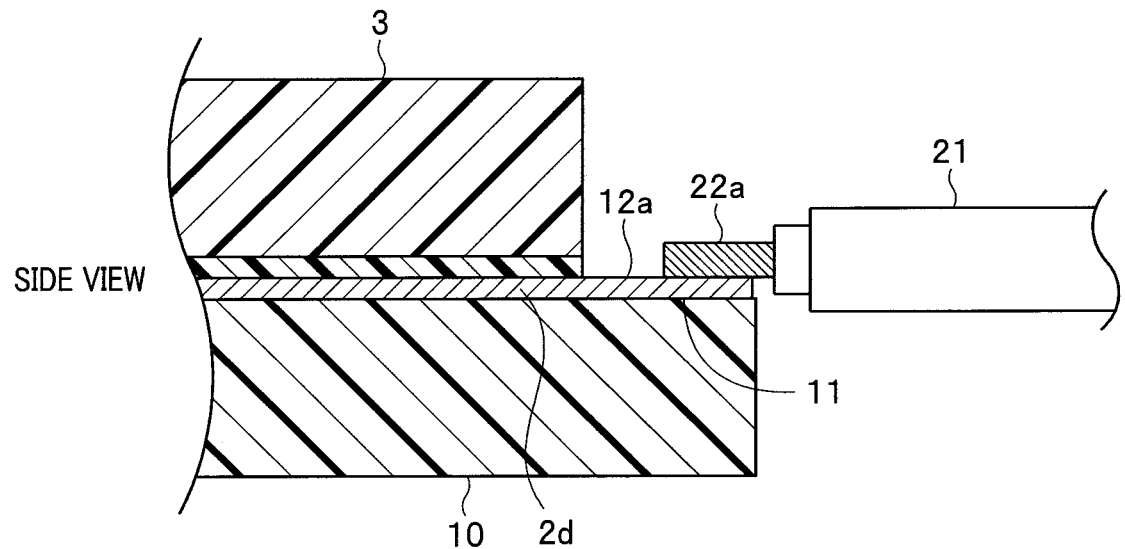
FIG. 6 is an explanatory diagram showing an example in which connection to external equipment is performed by soldering.
Figure 7:
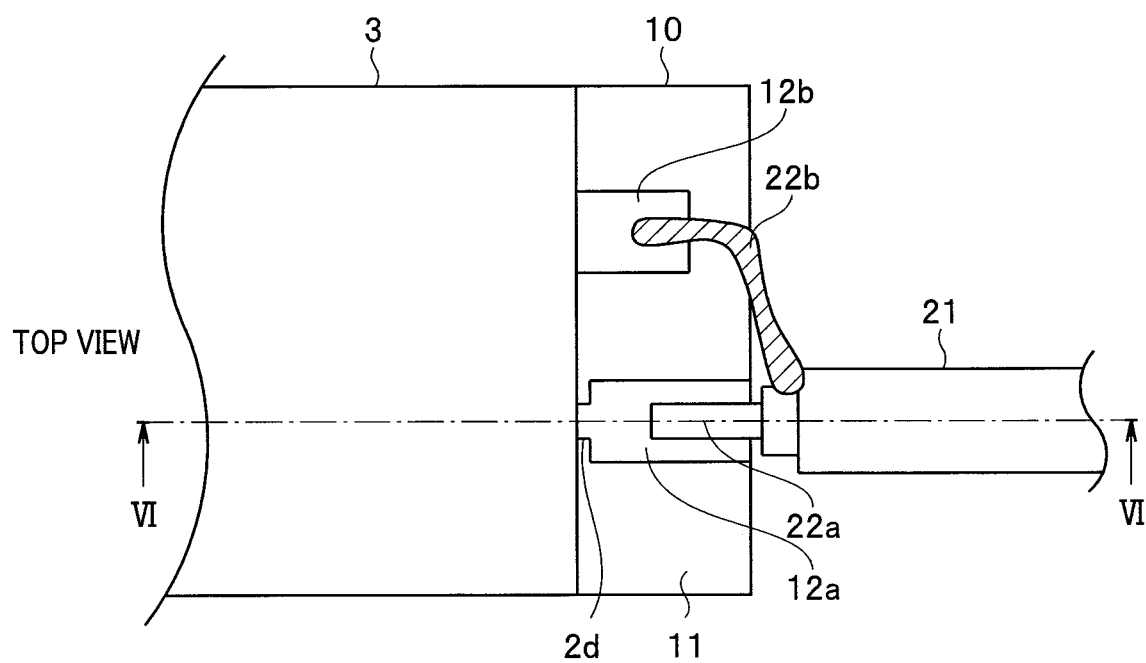
FIG. 7 is an explanatory diagram showing the example in which the connection to the external equipment is performed by the soldering.

FIG. 6 and FIG. 7 are explanatory diagrams showing an example in which connection to external equipment is performed by soldering. FIG. 6 and FIG. 7 show an example in which an electronic module is configured by MID structures 10 and 3. The MID structure 10 is different from the MID structure 2 in that the MID structure 10 includes a surface 11 extended further in the Y direction than the MID structure 3. FIG. 6 schematically shows a cross section taken along a ZY plane of a VI-VI line in FIG. 7. FIG. 7 schematically shows a state viewed from a top.

The surface 11 is a plane continuing to the surface 2c and the wire 2d is connected to a wide soldering electrode 12a on the surface 11. The wiring pattern 2g shown in FIG. 1 is connected to a wide soldering electrode 12b on the surface 11. As a cable line 21, for example, a shield line (a shield cable) may be adopted. Note that the shield cable is a cable obtained by covering a lead wire (a core wire) with foil or braid made of metal among electric communication cables in which metal lead wires are used. The shield cable can prevent interference of electromagnetic noise from an outside and, when there are a plurality of lead wires on an inside, can reduce interference among the lead wires. In FIG. 7, the cable line 21 includes a core wire 22a and a shield section conductor 22b configured by foil or braid made of metal that covers a circumference of the core wire 22a. The core wire 22a is soldered to the soldering electrode 12a. The shield section conductor 22b is soldered to the soldering electrode 12b. Consequently, a signal is transmitted to the wire 2d via the core wire 22a. Reference potential can be supplied to the metal pattern 3d from the shield section conductor 22b via the soldering electrode 12b and the wiring pattern 2g.

As explained above, in the example shown in FIG. 6 and FIG. 7, a region for solder connection can be secured by forming the MID structure 10 slightly longer than the MID structure 2. Note that the soldering electrode 12a is provided as many as the wires 2d.

In the example shown in FIGS. 6 and 7, an example is explained in which the soldering electrodes 12a and 12b are provided in the structure 10. However, the soldering electrodes 12a and 12b may be dividedly provided in the structures 2 and 3. For example, the terminal 3e shown in FIG. 1 may be provided and the shield section conductor 22b may be soldered to the terminal 3e.

Figure 8:
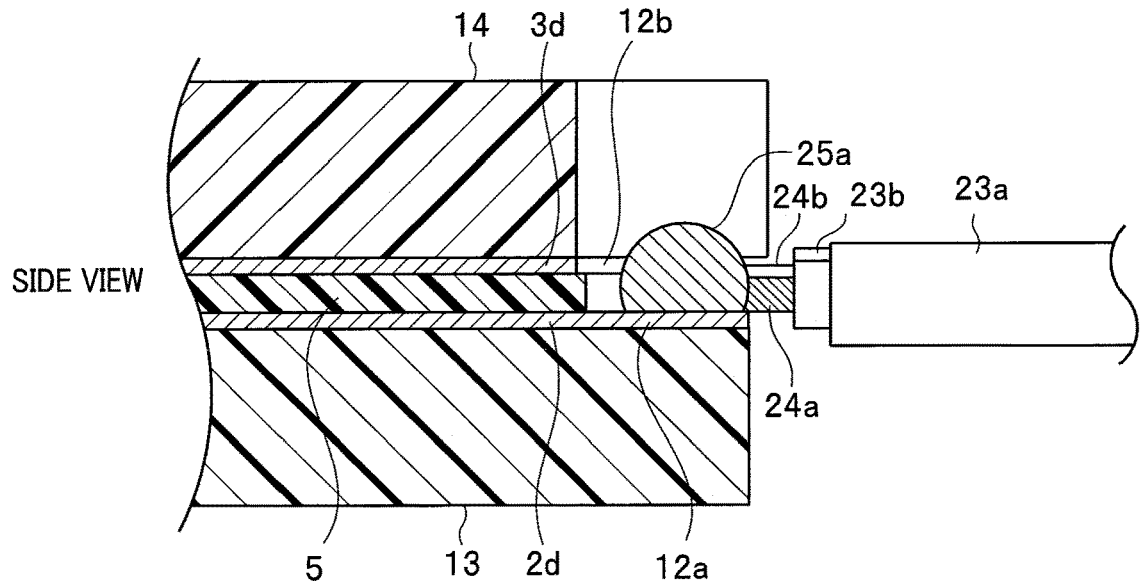
FIG. 8 is an explanatory diagram for explaining a soldering method.
Figure 9:
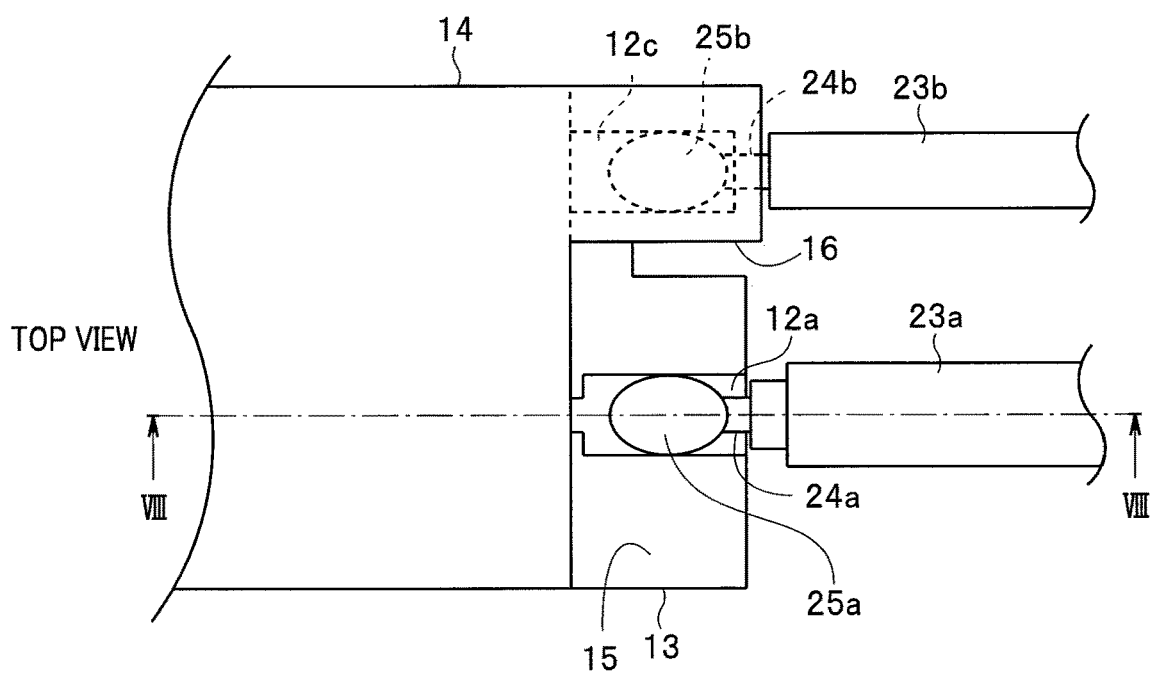
FIG. 9 is an explanatory diagram for explaining the soldering method.
Figure 10:
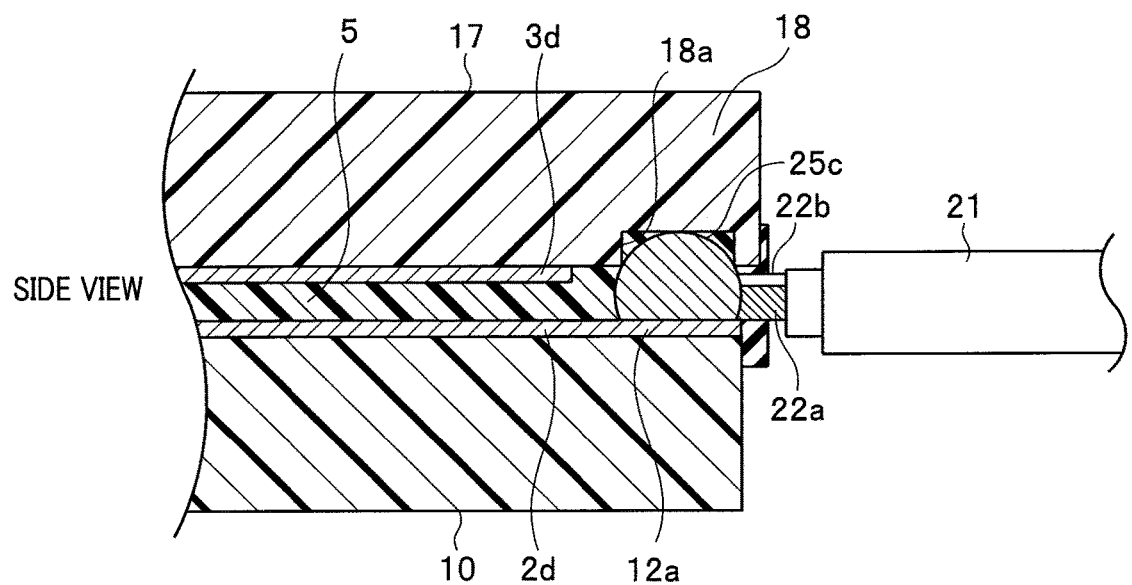
FIG. 10 is an explanatory diagram for explaining a soldering method.

FIG. 8 to FIG. 10 are explanatory diagrams for explaining another soldering method.

FIG. 8 and FIG. 9 show an example in which an electronic module is configured by MID structures 13 and 14. The MID structure 13 is different from the MID structure 10 shown in FIG. 6 and FIG. 7 in a plane shape of a surface 15 connected to the surface 2c. The MID structure 14 is different from the MID structure 3 in that the MID structure 14 includes a surface 16 connected to the surface 3c. Note that the surface 2c described here indicates the surface 2c shown in FIG. 1. FIG. 8 schematically shows a cross section taken along a ZY plane of a VIII-VIII line of FIG. 9. FIG. 9 schematically shows a state viewed from a top.

In the soldering method shown in FIG. 6 and FIG. 7, the core wire 22a and the shield section conductor 22b branching from one cable 21 are connected to the soldering electrodes 12a and 12b. Therefore, it is likely that a failure such as peeling is caused in the soldering electrodes 12a and 12b by stress corresponding to resilience of the core wire 22a and the shield section conductor 22b. Therefore, in FIG. 8 and FIG. 9, different cables are used as a cable for signal transmission connected to the wire 2d and a cable for GND for supplying GND potential to the metal pattern 3d.

As shown in FIG. 8 and FIG. 9, a surface 16 extending in the Y direction from an end side of the surface 3c is formed in the MID structure 14. The surface 16 is shorter than the surface 3c in a dimension in the X direction. A region opposed to the soldering electrode 12a of the MID structure 13 is absent on the surface 16. A soldering electrode 12c connected to the metal pattern 3d is formed on the surface 16. The surface 15 of the MID structure 13 is shorter than the surface 11 of the MID structure 10 in a dimension in the X direction. A region corresponding to the soldering electrode 12c of the MID structure 14 is absent on the surface 15. Therefore, the soldering electrodes 12a and 12c are respectively opened in the Z direction and a space for soldering is secured.

A cable line 23a includes a core wire 24a. The core wire 24a is soldered to the soldering electrode 12a by solder 25a. Signal transmission between the external equipment and the IC 4 is performed by the core wire 24a of the cable line 23a, the soldering electrode 12a, and the wire 2d. A cable line 23b includes a core wire 24b. The core wire 24b is soldered to the soldering electrode 12c by solder 25b. GND potential is supplied from the external equipment to the metal pattern 3d by the core wire 24b of the cable line 23b and the soldering electrode 12c.

As explained above, in the example shown in FIG. 8 and FIG. 9, the core wires 24a and 24b of the cables 23a and 23b can be respectively disposed in portions of the soldering electrodes 12a and 12c without causing unnecessary stress. A failure such as peeling of the soldering electrodes 12a and 12c less easily occurs.

FIG. 10 shows an example in which an electronic module is configured by MID structures 10 and 17. The MID structure 17 includes a region 18 extended to a region opposed the surface 11 of the MID structure 10 with respect to the MID structure 3. FIG. 10 schematically shows a cross section of the MID structures 10 and 17 taken along a position corresponding to the ZY plane of the VIII-VIII line of FIG. 7.

On a bottom surface of the region 18, a recess 18a is formed in a region corresponding to the soldering electrode 12a. Although not shown in FIG. 10, on the bottom surface of the region 18, a recess is formed in a region corresponding to the soldering electrode 12b as well. The recess 18a is configured to, when the MID structure 10 and the MID structure 17 are clamped, press solder 25c from above to press the core wire 22a soldered to the soldering electrode 12a. The not-shown recess formed in the region corresponding to the soldering electrode 12b is also configured to, when the MID structure 10 and the MID structure 17 are clamped, press not-shown solder from above to press the shield section conductor 22b soldered to the soldering electrode 12b. In the X direction and the Y direction, the not-shown recess and the recess 18a are formed generally in sizes corresponding to sizes in the X direction and the Y direction of the solder and press the solder in the X, Y, and Z directions.

As explained above, the solder 25c that fixes the core wire 22a to the soldering electrode 12a and the solder that fixes the shield section conductor 22b to the soldering electrode 12b are respectively pressed and fixed by the recess 18a and the not-shown recess. As a result, it is possible to prevent a failure such as peeling from being caused in the soldering electrodes 12a and 12b by stress of the core wire 22a and the shield section conductor 22b of the cables 23a and 23b.
(Differential Transmission)

In the above explanation, the example in which the wire 2d is the single wire is explained. However, the present embodiment can also be applied to differential transmission for feeding signals having mutually opposite phases with a pair of wires (differential wires). Since the differential transmission uses a difference between signals transmitted by the differential wires, external noise is cancelled. Therefore, the differential transmission can suppress malfunction and is suitable for high-speed signal transmission. Since electric currents flow in mutually opposite directions and magnetic fluxes generated by the signals are cancelled, there is also an advantage that EMI (electro magnetic interference) noise due to higher harmonic waves of the signals is reduced.

Therefore, an electronic module may be configured using the wire 2d shown in the respective figures referred to above as a pair of differential wires. Further, it is also possible to configure an electronic module in which the wire 2d, which is the single wire, and the differential wires are mixed.

Figure 11:
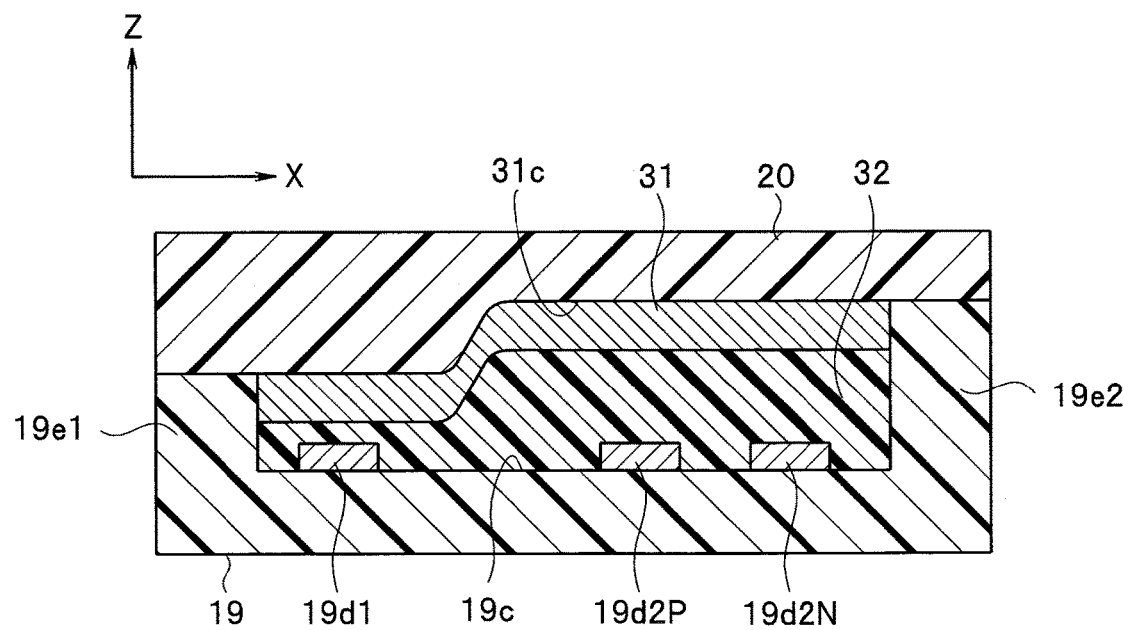
FIG. 11 is an explanatory diagram showing an electronic module in which a single wire and differential wires are mixed.

FIG. 11 is an explanatory diagram showing such an electronic module in which the single wire and the differential wires are mixed. FIG. 11 shows an example in which an electronic module is configured by MID structures 19 and 20. The electronic module shown in FIG. 11 includes the same characteristics as the characteristics of the electronic modules shown in the respective figures referred to above. FIG. 11 shows a cross section of a wiring surface position taken along a position equivalent to an XZ plane shown in FIG. 1.

Like the MID structures 2, 8, 10, and 13 explained above, the MID structure 19 includes the flat mounting surface 2a on which the IC 4 is mounted and a wiring surface 19c including the inclined surface 2b inclined with respect to the mounting surface 2a, wires 19d1, 19d2P, and 19d2N (hereinafter, these wires are representatively referred to as wire 19d as well) connected to the IC 4 being extended on the wiring surface 19c. Note that the MID structure 19 may also be configured in any shape including a spherical shape. The wires 19d1 is a single wire and the wires 19d2P and 19d2N are a pair of differential wires.

Note that, in FIG. 11, for simplification of the drawing, only one wire 19d1 and one pair of differential wires 19d2P and 19d2N are shown. However, a plurality of single wires and a plurality of pairs of differential wires may be extended.

Like the MID structures 3, 14, and 17 explained above, the MID structure 20 includes a surface 31c, on which a metal pattern 31 is formed, disposed with respect to the wiring surface 19c of the MID structure 19 with a dielectric region 32 interposed. A shape of the MID structure 20 may be formed in any shape excluding a shape of the surface 31c opposed to the wiring surface 19c.

In the present embodiment, the shape of the surface 31c corresponds to a shape of the wiring surface 19c in an extending direction of the wire 19d. On the other hand, in a direction orthogonal to the extending direction, that is, the X direction in which a plurality of wires 19d are arrayed, the shape of the surface 31c is a shape corresponding to the shape of the wiring surface 19c and distinction about whether the wire 19d is a single wire or differential wires. As shown in FIG. 11, thickness of the dielectric region 32 on the wire 19d1 and thickness of the dielectric region 32 on the wires 19d2P and 19d2N are different from each other.

In order to maintain such thickness of the dielectric region 32, in the example shown in FIG. 11, a spacer 19e1 is formed at one end portion in the X direction of the MID structure 19, that is, the direction orthogonal to the extending direction of the wire 19d and a spacer 19e2 is formed at the other end portion. Z-direction height of the spacer 19e1 and Z-direction height of the spacer 19e2 are different from each other. Thickness of the dielectric region 32 on the wire 19d1 and thickness of the dielectric region 32 on the wires 19d2P and 19d2N are maintained at predetermined thickness.

In the differential transmission (balanced transmission), since signals having mutually opposite polarities are applied to the pair of differential wires, it is necessary to optimize differential impedance. Note that uniformity and symmetry of paired differential wires are also important. It is not only preferable to uniformize only characteristic impedance of a wiring line. Unless the characteristic impedance is matched with load impedance, harmful effects occur, for example, a reflected wave occurs, waste occurs in transmission, and a waveform is disturbed. Therefore, in high-speed signal transmission, characteristic impedance and load impedance of a device input and output and a signal pattern are matched to prevent a reflected wave from occurring.

Usually, in single transmission, 50Ω often used in a coaxial cable is set as characteristic impedance by an impedance matching circuit to improve characteristics. However, in the differential transmission, differential impedance of 90 to 110Ω needs to be used for improvement of characteristics. A configuration in which circuits for the single transmission and the differential transmission are concurrently provided on the same substrate is also present.

In this regard, in the example shown in FIG. 11, optimization of the characteristic impedance and the differential impedance is possible. As explained above, the impedance of the wiring board is determined based on the width and the thickness of the wires, the distance to the GND layer functioning as the reference layer, and the specific dielectric constant of the insulator present between the wires and the GND layer. In the example shown in FIG. 11, setting of the width and the thickness, the distance, and the specific dielectric constant can be changed with high flexibility.

For example, when the characteristic impedance of the wire 19d1 is optimized to 50Ω, an optimum value of the differential impedance of the differential wires 19d2P and 19d2N is 100Ω. Therefore, when it is assumed that widths and thicknesses of the wire 19d1 and the wires 19d2P and 19d2N and a specific dielectric constant of the dielectric region 32 are uniform, if thicknesses of a dielectric region on the wire 19d1 and the wires 19d2P and 19d2N are in a relation of one to two, the characteristic impedance of the wire 19d1 and the differential impedance of the differential wires 19d2P and 19d2N can be optimized.

In this way, in the example shown in FIG. 11, in the electronic module in which the single wire and the differential wires are mixed, it is possible to optimize the characteristic impedance and the differential impedance with a simple configuration.

Note that, in FIG. 11, assuming that the widths and the thicknesses of the wire 19d1 and the wires 19d2P and 19d2N are the same, the thicknesses of the dielectric region on the wire 19*d*1 and the wires 19*d*2P and 19*d*2N are determined. However, the same effect can be obtained when the thicknesses of the dielectric region on the wire 19*d*1 and the wires 19*d*2P and 19*d*2N are made uniform and the widths of the wire 19*d*1 and the wires 19*d*2P and 19*d*2N are changed. Both of the widths and the thicknesses of the wire 19*d*1 and the wires 19*d*2P and 19*d*2N and the thicknesses of the dielectric region 32 on the wire 19*d*1 and the wire 19*d*2P and 19*d*2N may be changed to optimize the characteristic impedance and the differential impedance.

Second Embodiment

Figure 12:
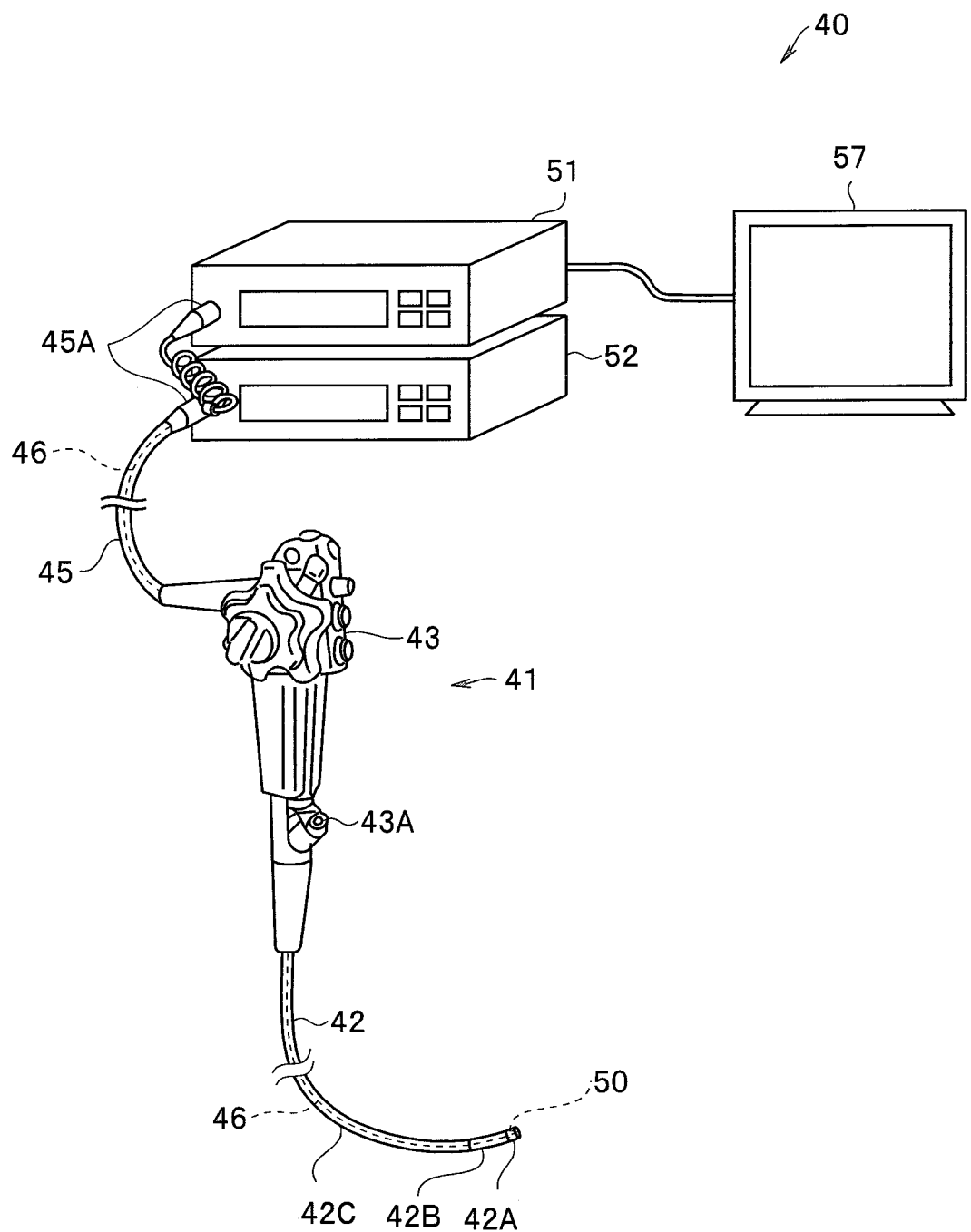
FIG. 12 is a diagram showing a second embodiment.

FIG. 12 is a diagram showing a second embodiment. In the present embodiment, the respective electronic modules explained above are applied to an endoscope system.

As shown in FIG. 12, an endoscope system 40 includes an endoscope 41, a video processor 51, a light source apparatus 52, and a monitor 57. The endoscope 41 includes an insertion section 42 insertable into a body cavity of a subject. A distal end portion 42A of the insertion section 42 includes an image pickup unit 50 (not shown in FIG. 12) for picking up an in vivo image of the subject. The image pickup unit 50 picks up an image of an inside of the subject and outputs an image pickup signal.

On a proximal end side of the insertion section 42 of the endoscope 41, an operation section 43 on which various buttons for operating the endoscope 41 are provided is disposed. The operation section 43 includes a treatment instrument insertion port 43A of a channel for inserting treatment instruments such as biological forceps, an electric knife, and a test probe into the body cavity of the subject. Note that a channel opening section is provided at a distal end of the insertion section 42.

The insertion section 42 is configured by the distal end portion 42A where an image pickup apparatus 1 is disposed, a bendable bending section 42B consecutively connected to a proximal end side of the distal end portion 42A, and a flexible tube section 42C consecutively connected to the proximal end side of the bending section 42B. The bending section 42B is bent by operation of the operation section 43.

A signal cable 46 connected to the image pickup unit 50 provided at the distal end portion 42A is inserted through a universal cord 45 disposed on the proximal end portion side of the operation section 43. The universal cord 45 is connected to the video processor 51 and the light source apparatus 52 via connectors 45A. The video processor 51 controls the entire endoscope system 40, performs signal processing for an image pickup signal outputted by the image pickup unit 50, and outputs an image signal. The monitor 57 receives the image signal from the video processor 51 and displays an endoscopic image.

The light source apparatus 52 includes, for example, a white LED and emits white light. The white light emitted by the light source apparatus 52 is guided to an illumination optical system (not shown) of the distal end portion 42A through a light guide (not shown) inserted through the universal cord 45 and is irradiated on the subject.

In the present embodiment, as the image pickup unit 50, the electronic module in the embodiment explained above can be adopted.

Figure 13:
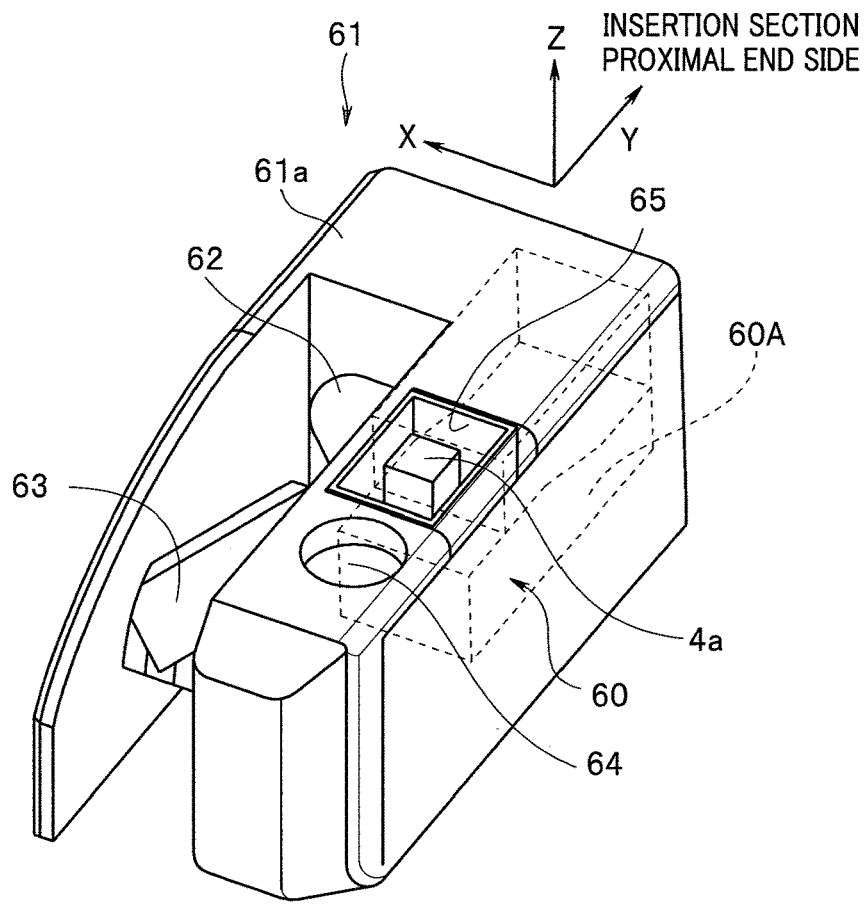
FIG. 13 is a perspective view showing an example in which an image pickup unit 60 adapted to a side-viewing endoscope is adopted as an image pickup unit 50.

FIG. 13 is a perspective view showing an example in which an image pickup unit 60 adapted to a side-viewing endoscope is adopted as the image pickup unit 50. Note that FIG. 13 shows an example of a specific configuration of a side-viewing distal end portion 61 adoptable as the distal end portion 42A shown in FIG. 12. The image pickup unit 60 shown in FIG. 13 corresponds to FIG. 4. Note that the image pickup unit 60 is configured by the electronic module 60A (a broken line portion in FIG. 13) equivalent to various electronic modules in the embodiment explained above, the IC 4 (not shown in FIG. 13) configuring an image pickup device, and the laminated lens 4*a*.

The distal end portion 61 shown in FIG. 13 is provided at the distal end of the insertion section 42 with the proximal end side of the distal end portion 61 consecutively connected to the bending section 42B. The distal end portion 61 includes a rigid distal frame section 61*a* in which a portion for storing the image pickup unit 60 and a portion where a channel opening section 62 for putting in and taking out a distal end of a treatment instrument inserted from the treatment instrument insertion port 43A is formed are juxtaposed.

A raising base (forceps elevator) 63 of the treatment instrument is disposed in a front of the channel opening section 62 (on a distal end side of the distal frame section 61*a*). The treatment instrument inserted through a treatment instrument insertion channel and taken out from the channel opening section 62 can change a direction of a distal end portion according to a motion of the raising base 63. Note that a small endoscope can also be projected from the channel opening section 62 through the treatment instrument insertion channel Such an insertion channel is configured by a member adopting a rigid material such as metal or resin in order to put in and take out a treatment instrument excellent in operability or prevent deformation at the time when a direction is changed on the raising base 63.

An illumination optical system 64 is disposed in a front of the image pickup unit 60. The not-shown light guide inserted through the universal cord 45 and the insertion section 42 from the light source apparatus 52 is guided to the illumination optical system 64. Illumination light is emitted to the subject from the illumination optical system 64.

The electronic module 60A at the distal end portion 61 is disposed such that a longitudinal direction of the distal end portion 61 is the Y direction in FIG. 4, a latitudinal direction of the distal end portion 61 is the X direction in FIG. 4, and a direction orthogonal to a surface spreading in the longitudinal direction and the latitudinal direction is the Z direction in FIG. 4. In other words, in the image pickup unit 60, an image pickup direction by the IC 4 and the laminated lens 4*a* is a direction orthogonal to an insertion direction of the insertion section 42 (the distal end portion 61). In other words, the image pickup unit 60, which is the electronic module, is disposed to pick up an image of a side surface when the endoscope is inserted.

The laminated lens 4*a* is provided on the IC 4 of the image pickup unit 60. The wires (the single wire such as the wire 2*d* and the differential wires such as the wires 19*d*2P and 19*d*2N) of the electronic module 60A are connected to the IC 4. The wires are connected to the signal cable 46 inserted through the insertion section 42. Consequently, the IC 4 is driven by the video processor 51, photoelectrically converts an object optical image, and outputs an image pickup signal to the video processor 51 through the wires and the signal cable 46. As explained above, the characteristic impedance of the wires is optimized. The high-frequency characteristics of the electronic module 60A are excellent. Therefore, a high-quality picked-up image can be acquired by the IC 4.

Since the insertion section 42 and the distal end portion 61 are inserted into the body cavity of the subject, the insertion section 42 and the distal end portion 61 need to be reduced in diameter in order to reduce pains of the subject. In the electronic module 60A, the wires are provided between the two MID structures and the wires can be extended not only in the X direction and the Y direction but also in the Z direction. Therefore, an external shape of the electronic module 60A can be designed in any shape and, irrespective of disposition of the IC 4 and the laminated lens 4a, the electronic module 60A can be disposed in an appropriate position in the distal end portion 61. Therefore, the image pickup unit 60 can be disposed in an appropriate position in an appropriate shape corresponding to a shape of the distal end portion 61. For example, as shown in FIG. 13, the IC 4 and the laminated lens 4a can be disposed in a recess 65 of the distal end portion 61 and the distal end portion 61 can be reduced in size.

As explained above, in the present embodiment, the endoscope includes the image pickup unit in which the electronic module in the embodiment explained above is used. The electronic module has a configuration in which the wires and the metal pattern are disposed to be opposed with the dielectric region having a specified thickness interposed and is excellent in high-frequency characteristics. Therefore, a high-quality picked-up image can be obtained by the image pickup unit. In the electronic module, the wires can be extended in three-dimensional directions and an external shape of the electronic module can be set as appropriate. Therefore, it is possible to easily dispose the electronic module at the distal end portion of the insertion section reduced in diameter while extending the wires in any direction irrespective of disposition of the image pickup unit. By adopting the electronic module, which is a characteristic of the present invention, in this way, it is possible to reduce a side-viewing endoscope in size and it is possible to provide an endoscope product having high reliability and easy to use through reliable treatment instrument control and image pickup device control.

(Modification)

Figure 14:
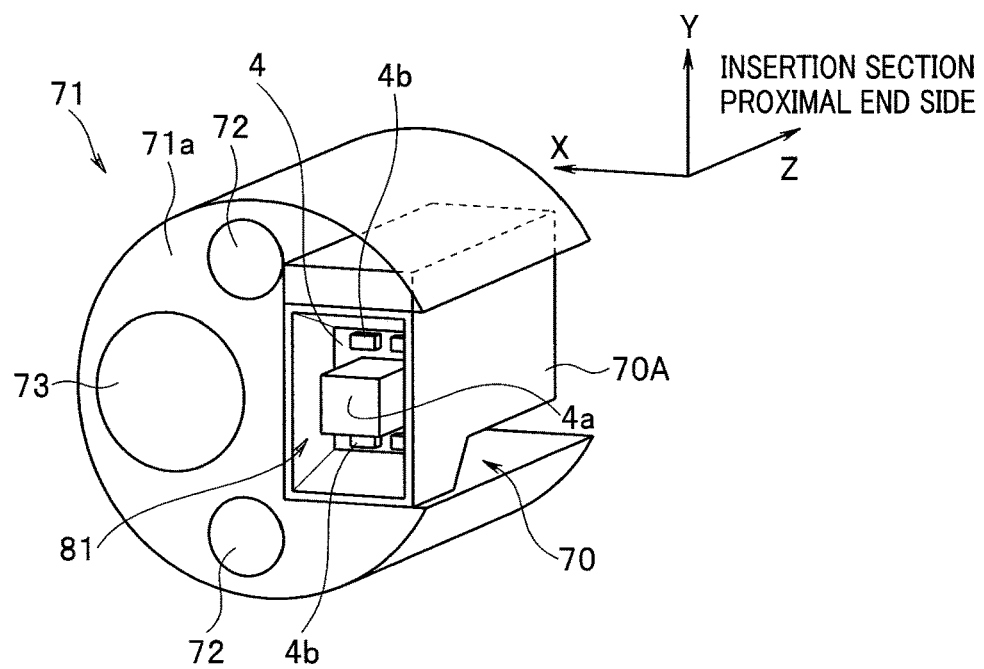
FIG. 14 is a perspective view showing an example in which an image pickup unit 70 adapted to a front-viewing endoscope is adopted as the image pickup unit 50.

FIG. 14 is a perspective view showing an example in which an image pickup unit 70 adapted to a direct-viewing endoscope is adopted as the image pickup unit 50. Note that FIG. 14 shows, with a part fractured, an example of a specific configuration of a direct-viewing distal end portion 71 adoptable as the distal end portion 42A shown in FIG. 12. The image pickup unit 70 shown in FIG. 14 is configured by an electronic module 70A including the characteristics in the embodiment explained above, the IC 4, which is the image pickup device, and the laminated lens 4a.

The distal end portion 71 shown in FIG. 14 is provided at the distal end of the insertion section 42 with the proximal end side of the distal end portion 71 consecutively connected to the bending section 42B. The distal end portion 71 includes a rigid distal frame section 71a in which a portion for storing the image pickup unit 70 and a portion where a channel opening section 72 for putting in and taking out, from the distal end side of the distal frame section 71a, a distal end of a treatment instrument inserted from the treatment instrument insertion port 43A and an illumination optical system 73 that irradiates an object with illumination light from a light guide are provided are juxtaposed.

Figure 15:
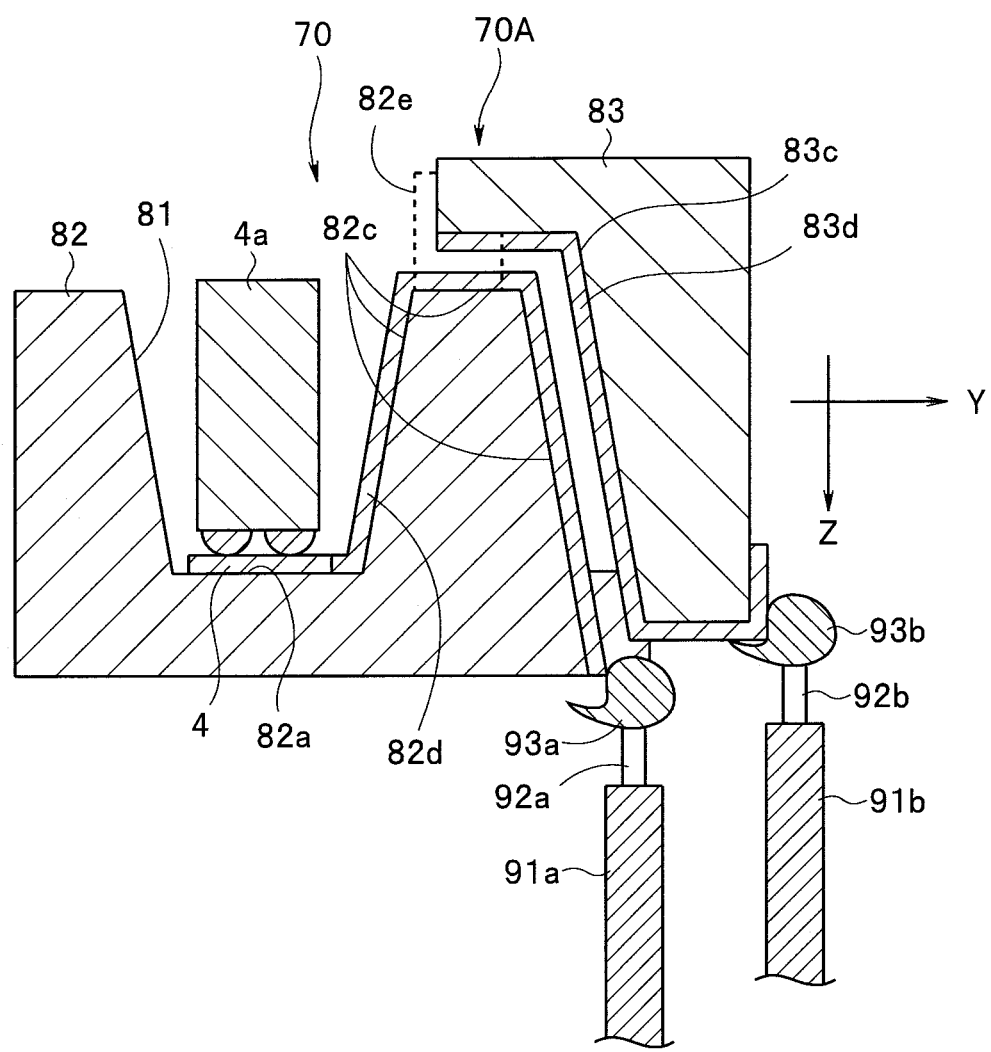
FIG. 15 is a sectional view schematically showing an example of a specific configuration of the image pickup unit 70.

FIG. 15 is a sectional view schematically showing an example of a specific configuration of the image pickup unit 70.

The electronic module 70A is configured by MID structures 82 and 83. The MID structure 82 is a housing including a cavity section 81. Note that, although the MID structure 83 is described, this member does not always need to be configured by the MID. A bottom surface of the cavity section 81 configures a mounting surface 82a on which the IC 4 is mounted. The laminated lens 4a is loaded on the IC 4.

On a surface of the MID structure 82, a wiring surface 82c configured by a wall surface of the cavity section 81 and an upper surface and a side surface of the MID structure 82 is formed adjacent to the mounting surface 82a. A wire 82d formed by a single wire and differential wires connected to the IC 4 is extended on the wiring surface 82c. The wire 82d is connected to a core wire 92a of a cable 91a by solder 93a at a side surface lower end of the MID structure 82. Note that, usually, wires 82d of a plurality of systems are extended on the wiring surface 82c.

In the MID structure 83, a surface 83c opposed to the wiring surface 82c of the MID structure 82 and having a shape that changes according to a shape of the wiring surface 82c is formed. A metal pattern 83d is formed on a surface of the surface 83c. Note that the metal pattern 83d may be formed on the substantially entire surface of the surface 83c. In other words, by disposing the MID structure 82 and the MID structure 83 to be opposed to separate the wiring surface 82c and the surface 83c by a predetermined distance, the metal pattern 83d is designed to extend along and at a specific distance apart from all of the wires 82d respectively according to undulations in the Y and Z directions of the wires 82d of the MID structure 82.

Cables 91a and 91b are inserted through the insertion section 42 and connected to the video processor 51. Consequently, the video processor 51 supplies a signal for driving the IC 4 through the cable 91a and the wire 82d and supplies reference potential to the metal pattern 83d through the cable 91b. Consequently, the metal pattern 83d functions as the GND layer.

Since the wire 82d and the metal pattern 83d are disposed to be opposed while keeping the specific distance, it is possible to set characteristic impedance and differential impedance of the wire 82d to optimum values irrespective of external shapes of the MID structures 82 and 83. Note that a dielectric region between the MID structure 82 and the MID structure 83 may be filled with an adhesive having a predetermined specific dielectric constant.

A spacer 82e is provided in order to specify a distance between the wire 82d of the MID structure 82 and the metal pattern 83d of the MID structure 83 to a specific distance. In the example shown in FIG. 15, the spacer 82e is L-shaped in a cross section and can maintain intervals in the Z and Y directions between the MID structure 82 and the MID structure 83 constant.

Note that dimensions of the spacer 82e and dimensions of a cross section of the spacer 82e orthogonal to an extending direction of the wire 82d are determined such that the characteristic impedance (or the differential impedance) of the wire 82d is optimized. The example shown in FIG. 15 simplifies and shows a position of the spacer 82e and is not limited to this.

The image pickup unit 70 configured in this way is stored in the distal end portion 71 as shown in FIG. 14.

In the example shown in FIG. 15, the cavity section 81 is provided in the MID structure 82, the IC 4 and the laminated lens 4a are mounted on the mounting surface 82a of the bottom surface of the cavity section 81, and the wire 82d connected to the IC 4 is extended to the side surface of the MID structure 82 beyond the wall section of the cavity section 81. In other words, the example shown in FIG. 15 has a structure in which the wire 82d is easily extended in a direction on an opposite side of an image pickup direction of the IC 4 and the laminated lens 4a mounted on the mounting surface 82a. Finally, the wire 82d is connected to the cable 91a inserted through the insertion section 42. In other words, the example shown in FIG. 15 is suitable for the direct-viewing endoscope in which the insertion direction of the insertion section 42 and the image pickup direction coincides with the Z direction as shown in FIG. 14.

As explained above, in this modification as well, the image pickup unit 70 adopts the electronic module 70A having the characteristics in the embodiment explained above, makes it possible to acquire a high-quality endoscopic image with satisfactory high-frequency characteristics, and contributes to a reduction in a diameter of the distal end portion 71.

Note that the MID structure 82 also has a function of protecting the IC 4 and the laminated lens 4a with the cavity section 81 and preventing, with the wall section, influence of harmful light made incident on the laminated lens 4a.

In the example shown in FIG. 15, the surface 83c and the metal pattern 83d of the MID structure 83 are not formed in a portion of the wire 82d on the wall surface of the cavity section 81. However, in this portion as well, the metal pattern 83d may be configured to be disposed with the wire 82d and a dielectric region having predetermined thickness interposed.

Third Embodiment

Figure 16:
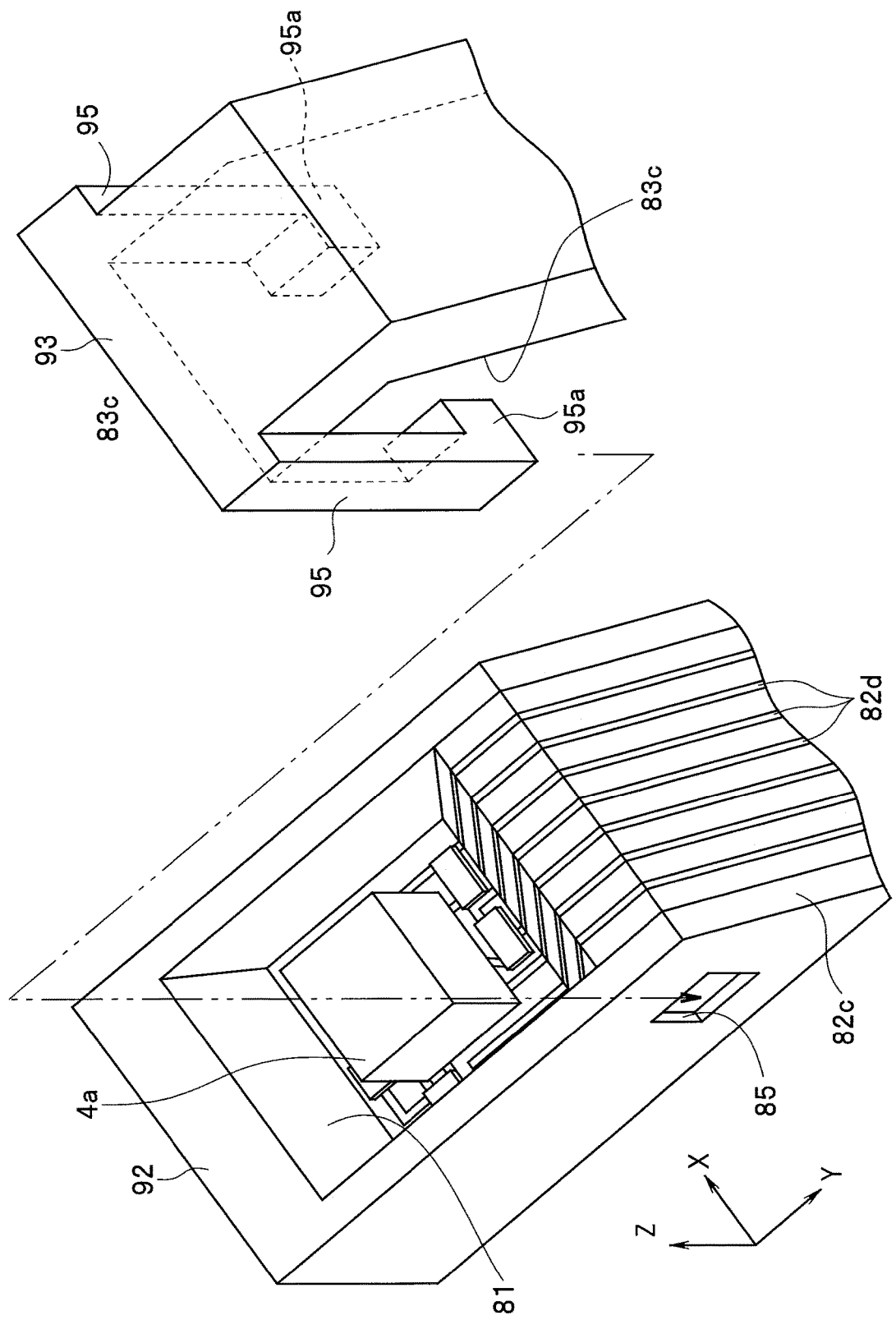
FIG. 16 is a perspective view showing a third embodiment.

FIG. 16 is a perspective view showing a third embodiment. In FIG. 16, the same components as the components shown in FIG. 15 are denoted by the same reference numerals and signs and explanation of the components is omitted.

The electronic modules in the respective embodiments adopt the protrusion-like or wall-like spacer members in order to maintain the thickness of the dielectric region between the two structures at the predetermined thickness. In contrast, in the present embodiment, an arm-shaped supporting member is adopted as a spacer member instead of or together with these spacer members.

An MID structure 92 is different from the MID structure 82 shown in FIG. 15 in that the MID structure 92 includes locking sections 85 on a side surface. The locking sections 85 are provided in two places on one side surface and the other side surface in the X direction of the MID structure 92. In the MID structure 93, an arm-shaped pair of supporting members 95 extended downward (toward the MID structure 92 side) is provided at both end portions in the X direction of an upper surface end side. Locking sections 95a projecting in directions facing each other are provided at lower ends of the pair of supporting members 95.

The surface 83c of the MID structure 93 is brought close to the wiring surface 82c of the MID structure 92 while being opposed to the wiring surface 82c so that the locking sections 95a of the supporting members 95 engage with the locking sections 85 of the MID structure 92. When the locking sections 95a engage with the locking sections 85, the MID structure 92 and the MID structure 93 are fixed to each other in the X direction, the Y direction, and the Z direction.

Since the supporting members 95 are stretched between the side surfaces of the MID structures 92 and 93 and fixed by the locking sections 95a and 85 in this way, the MID structure 92 and the MID structure 93 are fixed to each other. Consequently, a dielectric region having specific thickness can be formed between the metal pattern 83d of the MID structure 93 and the wire 82d of the MID structure 92. Note that an adhesive having a predetermined specific dielectric constant may be interposed in the dielectric region.

As explained above, in the present embodiment, it is possible to obtain the same effects as the effects in the respective embodiments explained above and it is possible to simplify processes such as holding at a bonding time.

Note that, in FIG. 16, an example is explained in which the present invention is applied to the electronic module shown in FIG. 15. However, the present invention is applicable to the respective electronic modules in the respective embodiments explained above.

The present invention is not limited to the embodiments explained above. Various changes, alterations, and the like are possible in a range in which the gist of the present invention is not changed. For example, besides, an application is possible in which the portion explained as the endoscope is replaced with a camera for consumers, an industrial camera, a vehicle-mounted camera, a monitoring camera, and the like. The electronic module in the present invention has satisfactory high-frequency characteristics and is, without being limitedly applied to the image pickup apparatus, applied to various kinds of electronic equipment that treat a high-frequency signal to be capable of improving characteristics of the electronic equipment. The electronic module in the present invention is configured by the MID structure and is easily incorporated in electronic equipment. Therefore, the electronic module can be applied to a portable terminal requested to be reduced in size and weight because of portability, a network terminal such as an AI (artificial intelligence) speaker desired to be set in a small place, an IoT (Internet of Things) home electronic appliance, and a watch camera that watches daily life and guarantees safety of targets. Further, it is also easy to incorporate the electronic module in a robot (including an electronic cleaner) and a mobile body such as a drone having importance in a reduction in size, a reduction in weight, and a center of gravity and a balance of equipment because a moving function is important.

The three-dimensional wiring board including the electronic module and the cavity section of the image pickup unit described above does not need to be limited to a three-dimensional wiring board manufactured by an MID technique by injection molding and may be manufactured by machining by a 3D printer or cutting. A material is not limited to the resin. Ceramic or glass epoxy may be used.

What is claimed is:

1. An electronic module comprising:
   a first structure including a mounting surface having a planar shape on which an integrated circuit is mounted and a wiring surface including a surface including a portion that changes in a direction perpendicular to the mounting surface, a wire connected to the integrated circuit being extended on the wiring surface;
   a second structure disposed with a dielectric region interposed with respect to the wiring surface of the first structure, a metal pattern being provided on the second structure; and
   at least one spacer member that equalizes thickness of the dielectric region between the wire and the metal pattern in an entire range between the mounting surface and the wiring surface including the surface including the portion that changes in the direction perpendicular to the mounting surface.

2. The electronic module according to claim 1, further comprising an adhesive with which the dielectric region is filled to bond the first and second structures.

3. The electronic module according to claim 1, wherein the wiring surface including the surface including the portion that changes in the direction perpendicular to the mounting surface is an inclined surface inclined with respect to the mounting surface.

4. The electronic module according to claim 1, wherein at least one of the at least one spacer member is formed by a metal material and is connected to a wire connected to the metal pattern to apply potential to the metal material.

5. The electronic module according to claim 1, wherein
the integrated circuit has an image pickup function,
the first structure includes a cavity section, and
the integrated circuit is disposed on a bottom surface of the cavity section, and the cavity section includes a wall structure in substantially a same direction as an image pickup direction of the integrated circuit.

6. The electronic module according to claim 1, wherein
a soldering pattern for soldering a cable is provided at an end portion in an extending direction of the wire of the first structure, and
the second structure includes an avoidance space corresponding to dimensions of solder in the soldering pattern.

7. The electronic module according to claim 1, wherein thickness of the dielectric region is determined according to dimensions of a cross section of the wire and a specific dielectric constant of the dielectric region.

8. The electronic module according to claim 1, wherein at least one wire of a single wire or a differential wire is extended on the wiring surface.

9. The electronic module according to claim 1, wherein the spacer member is configured by at least one member having a protrusion shape and being disposed between the first structure and the second structure.

10. The electronic module according to claim 1, wherein the spacer member is configured by at least one member having a wall shape and being disposed between the first structure and the second structure.

11. The electronic module according to claim 1, wherein the spacer member is configured by at least one member that is stretched between the first structure and the second structure and mutually supports the first structure and the second structure.

12. A manufacturing method for an electronic module comprising clamping, using at least one spacer member, a first structure including a mounting surface having a planar shape on which an integrated circuit is mounted and a wiring surface including a surface including a portion that changes in a direction perpendicular to the mounting surface, a wire connected to the integrated circuit being extended on the wiring surface, and a second structure on which a metal pattern is provided, in a state in which a dielectric region having equal thickness is interposed between the wire and the metal pattern in an entire range between the mounting surface and the wiring surface including the surface including the portion that changes in the direction perpendicular to the mounting surface.

13. An endoscope comprising:
an insertion section;
an electronic module including a first structure provided in the insertion section and including a mounting surface having a planar shape on which an integrated circuit is mounted and a wiring surface including a surface including a portion that changes in a direction perpendicular to the mounting surface, a wire connected to the integrated circuit being extended on the wiring surface, a second structure disposed with a dielectric region interposed with respect to the wiring surface of the first structure, a metal pattern being provided on the second structure, and at least one spacer member that equalizes thickness of the dielectric region between the wire and the metal pattern in an entire range between the mounting surface and the wiring surface including the surface including the portion that changes in the direction perpendicular to the mounting surface; and
an image pickup apparatus loaded on the integrated circuit.

* * * * *